United States Patent [19]

Ohshima et al.

[11] Patent Number: 5,763,321
[45] Date of Patent: *Jun. 9, 1998

[54] METHOD OF MANUFACTURING SEMICONDUCTOR DEVICE UTILIZING SELECTIVE CVD METHOD

[75] Inventors: Yoichi Ohshima, Yokohama, Japan; Hideaki Aochi, Wappingers Falls, N.Y.

[73] Assignee: Kabushiki Kaisha Toshiba, Kawasaki, Japan

[*] Notice: The term of this patent shall not extend beyond the expiration date of Pat. No. 5,476,814.

[21] Appl. No.: 554,753

[22] Filed: Nov. 7, 1995

Related U.S. Application Data

[63] Continuation of Ser. No. 267,432, Jun. 29, 1994, Pat. No. 5,476,814.

[30] Foreign Application Priority Data

Jul. 9, 1993  [JP]  Japan ................... 5-170068

[51] Int. Cl.$^6$ ................... H01L 21/283
[52] U.S. Cl. ................... 438/618; 438/620; 438/622; 438/655; 438/656; 438/675; 438/677
[58] Field of Search ................... 438/618, 620, 438/622, 625, 629, 630, 641, 675, 722, 655, 656

[56] References Cited

U.S. PATENT DOCUMENTS

| | | | |
|---|---|---|---|
| 4,622,735 | 11/1986 | Shibata | 748/DIG. 19 |
| 4,902,533 | 2/1990 | White | 427/99 |
| 4,966,868 | 10/1990 | Murali et al. | 437/192 |
| 5,002,902 | 3/1991 | Watanabe | 437/235 |
| 5,023,201 | 6/1991 | Stanasolovich et al. | 437/192 |
| 5,192,713 | 3/1993 | Harada | 437/192 |
| 5,204,286 | 4/1993 | Doan | 437/195 |
| 5,286,673 | 2/1994 | Nishihara | 437/187 |
| 5,324,536 | 6/1994 | Yonehara | 429/99 |

FOREIGN PATENT DOCUMENTS

| | | |
|---|---|---|
| 0 427 254 | 11/1990 | European Pat. Off. |
| 0 465 152 | 6/1991 | European Pat. Off. |
| 2151034 | 6/1990 | Japan . |
| 2-272747 | 11/1990 | Japan . |
| 5-23490 | 9/1993 | Japan .......... 427/99 |

*Primary Examiner*—T. N. Quach
*Attorney, Agent, or Firm*—Banner & Witcoff, Ltd.

[57] ABSTRACT

A method of manufacturing semiconductor devices, includes the step of forming a first conductive region of a first conductive material for effecting a growth of a conductive film thereon by a selective growth method. Also, a second conductive region of a second conductive material for not effecting a growth of a conductive film is formed in the selective growth method. An insulating layer is covered with the first and second conductive regions. Further, a through hole in the insulating layer for filling the hole with the conductive film is formed. The conductive film is grown within the through hole over the first conductive region, thereby filling the through hole with the conductive film.

34 Claims, 7 Drawing Sheets

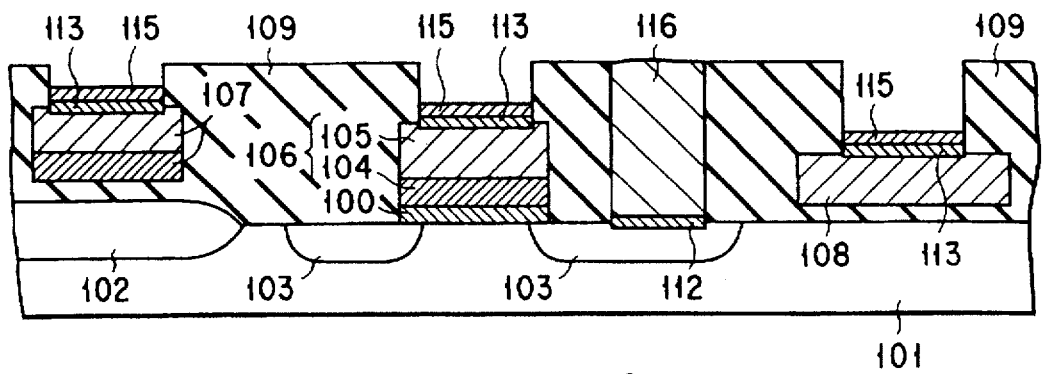
F I G. 10
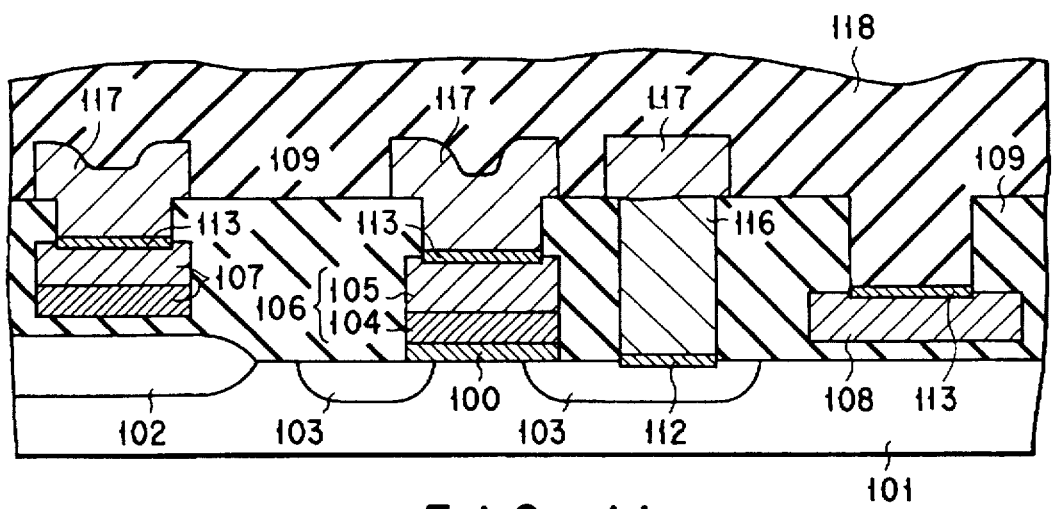
F I G. 11
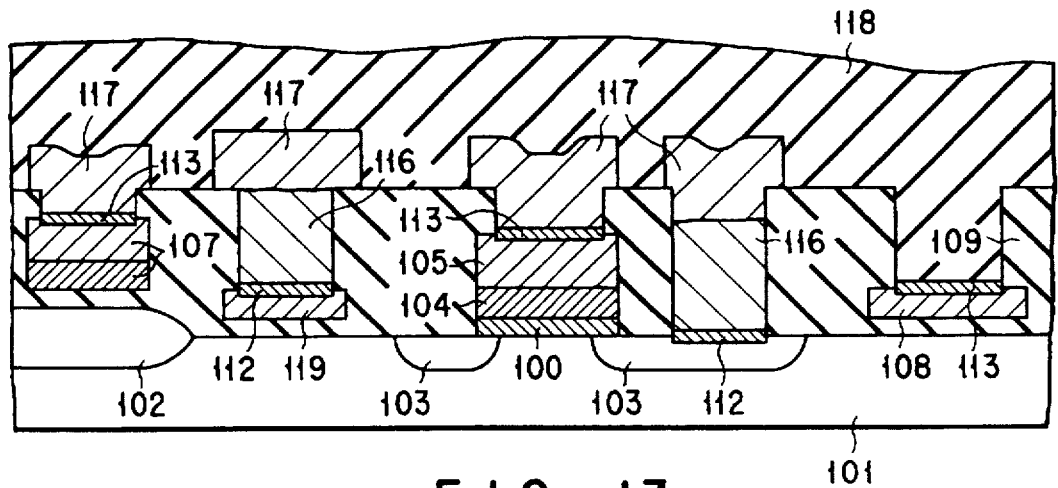
F I G. 13

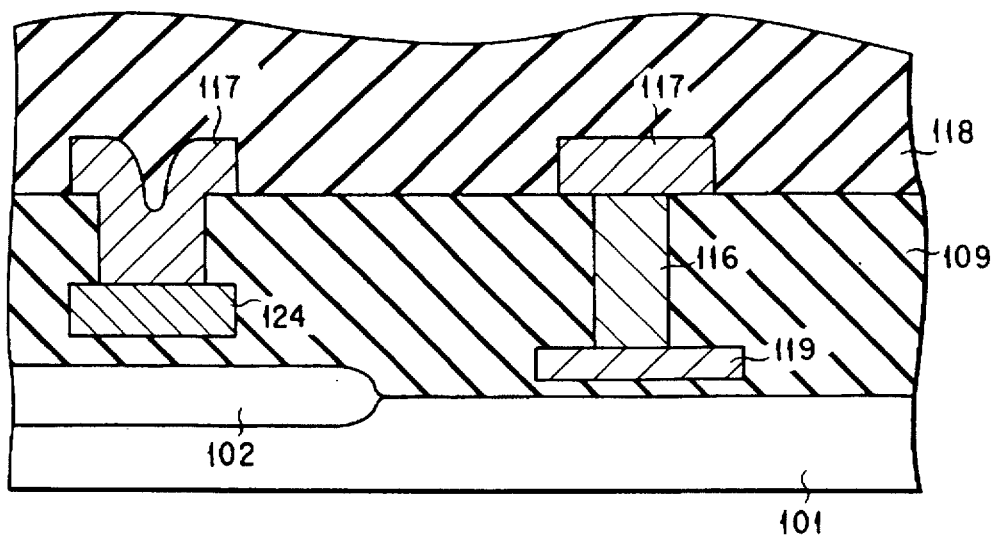
F I G. 15
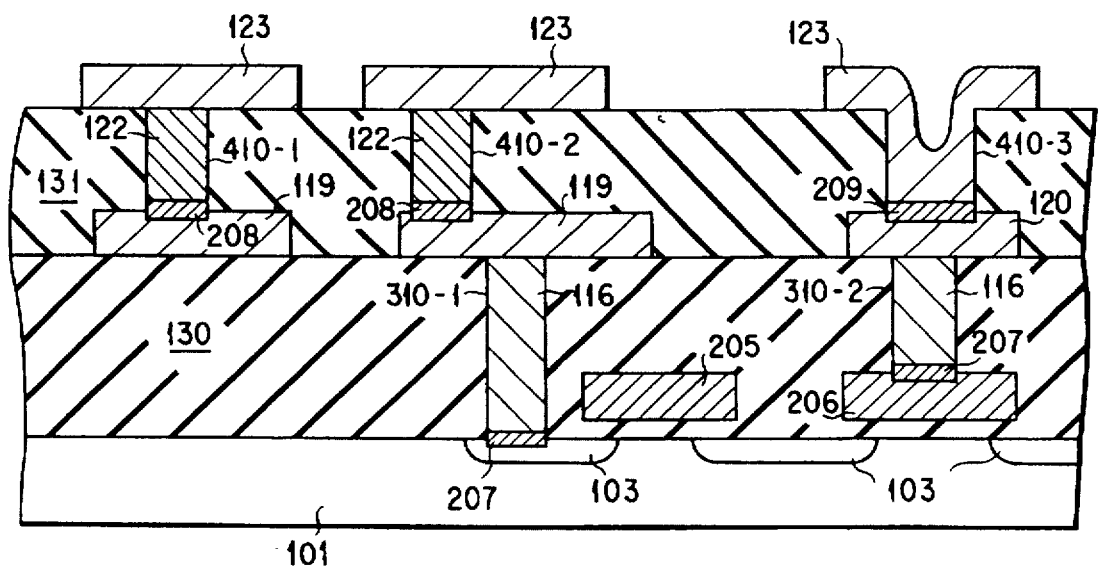
F I G. 16

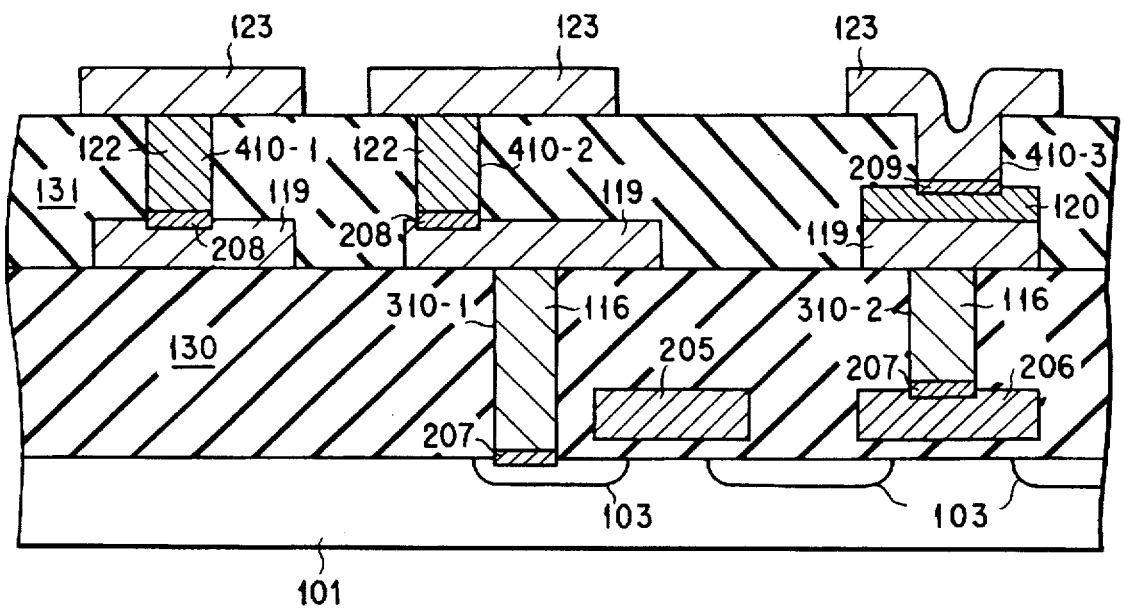
F I G. 17
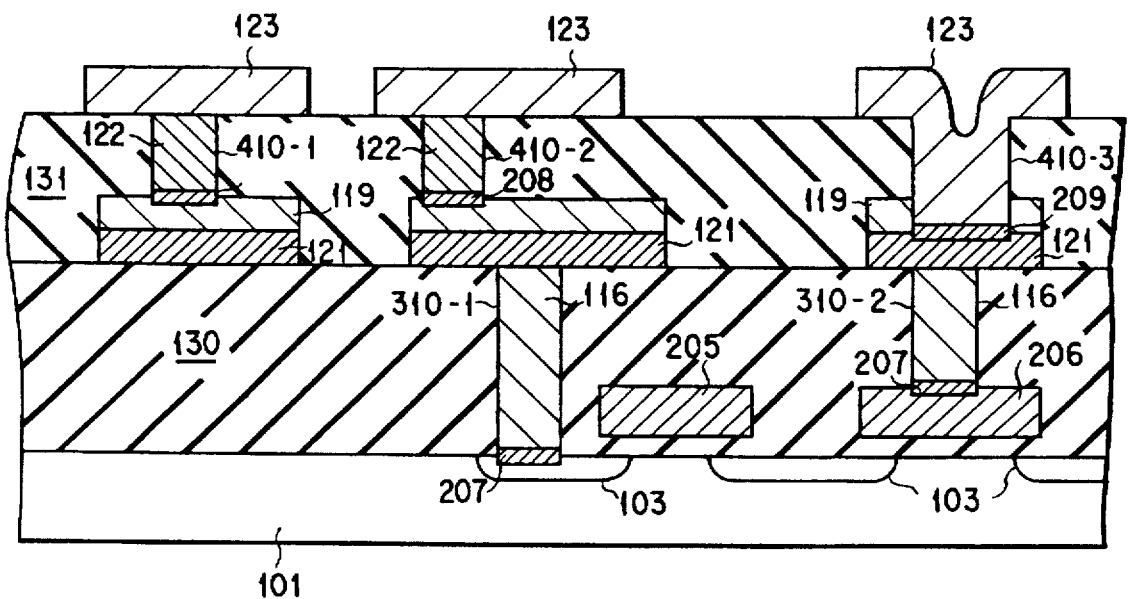
F I G. 18

METHOD OF MANUFACTURING SEMICONDUCTOR DEVICE UTILIZING SELECTIVE CVD METHOD

This application is a continuation of application Ser. No. 08/267,432, filed Jun. 29, 1994, now U.S. Pat. No. 5,476,814.

BACKGROUND OF THE INVENTION

1. Field of the Invention

This invention relates to a method of manufacturing a semiconductor device, wherein a through hole formed at a predetermined portion in a semiconductor substrate is buried with a conductive material by selectively growing a high-melting point metal such as tungsten on a specific conductive material exposed on the bottom of the through hole by utilizing a selective CVD (chemical vapor deposition) method.

2. Description of the Related Art

With a recent trend of increased density of a semiconductor integrated circuit, a contact hole to be formed in the insulating layer on a semiconductor substrate becomes high in aspect ratio. As a result, a technique of burying a contact hole with a conductive material is now being adopted in an attempt to keep the surface of an insulating as flat as possible and to assure the reliability of a wiring layer to be formed on the insulating layer.

As a means to bury a contact hole (through hole), there have been known a blanket method and a selective CVD method.

According to the blanket method, a conductive material such as tungsten is deposited all over the surface of an insulating layer including the interior of a through hole formed in an insulating layer on a semiconductor substrate, and then the whole surface of the deposited layer is etched back so as to ultimately leave tungsten only in the through hole.

On the other hand, according to the selective CVD method, a high-melting point metal such as tungsten is selectively grown only on a specific conductive material exposed on the bottom of a through hole.

Both of the methods are different in process from each other, and have both advantages and disadvantages.

In the selective CVD method, the characteristics of a high-melting point metal halide that the reduction reaction rate thereof is dependent largely on an underlayer is utilized. For example, in the case of WF6, a tungsten film can be deposited only on a specific material such as Si and W, and can be hardly deposited on an insulating material such as $SiO_2$. Therefore, this phenomenon is very useful in filling a through hole or via hole with a high-melting point metal.

In this selective CVD method however, it is required in order to achieve a desirable selectivity to the underlayer to determine an optimum condition for effecting a reduction reaction such as hydrogen reduction or silane reduction of $WF_6$ by adjusting the deposition temperature or flow ratio of a mixed gas.

This selective CVD method however has been found to have the following defects.

It is very difficult to distinguish a film which allows the growth of for example tungsten from a film which does not allow the growth of tungsten among exposed films of conductive materials usually employed for semiconductor devices, such as silicon, a high-melting point metal and a metal silicide.

A reason for this is that the deposition conditions such as deposition temperature and flow ratio of a mixed gas are required to be delicately adjusted, thus setting forth problems of stability and reproducibility in an actual process, and thereby causing tungsten to grow on every exposed surfaces of the conductive materials during the step of the selective growth. As a result, it is not possible under such circumstances to distinguish a film which allows the growth of for example tungsten from a film which does not allow the growth of tungsten.

Therefore, when there are a plurality of through holes different in depth from each other and if tungsten is indiscriminately grown burying the through holes, the shallowest through hole is first filled with tungsten, and then next shallowest through hole is filled with tungsten, and so on. Accordingly, when the growth of tungsten is continued in this manner, tungsten filling the shallowest through hole overflows from the brim of the through hole. Therefore, with this selective growth method, the amount of tungsten to be grown is inevitably restricted according to the depth of the shallowest through hole.

FIG. 1 explains one embodiment of the conventional selective CVD method.

In this selective CVD method, a MOS transistor is formed on a silicon substrate 201, wherein the reference numeral 203 denotes a diffusion layer, 204 a gate insulating film, and 206 a gate electrode (wiring) consisting for example of tungsten silicide-polycide. After depositing an oxide insulating film 218 all over the substrate, predetermined portions of the oxide insulating film 218 for example over the silicon substrate 201, over the diffusion layer 203 or over the gate electrode 206 are perforated to form through holes 210-1, 210-3 and 210-6.

The depth of each of the through holes 210-1, 210-3 and 210-6 is dependent upon the material of the underlayer disposed at the bottom of each through hole.

When the conventional selective CVD method is subsequently executed to grow a layer of tungsten 216, the growth of tungsten is obstructed on the oxide insulating film 218, but the growth of tungsten is effected selectively as shown in FIG. 2 on the silicon substrate 201, the diffusion layer 203 and the gate electrode 206 exposed on the bottoms of these through holes.

In this case, since the depth of each of through holes differs according to the material of the underlayer, if the growth of tungsten is effected to match with the depth of the through holes 210-1 and 210-3, tungsten 216 overflows from the brim of the shallow through hole 210-6.

On the other hand, there is another technique different from that explained above in the selective growth of tungsten. According to this technique, as shown in FIG. 3, the growth of tungsten is effected to match with the depth of the shallowest through holes 210-6 so that the deep through holes 210-1 and 210-3 are incompletely filled with tungsten as in the case of a non-volatile memory wherein the shallowest through hole 210-6 is formed over a control gate electrode of a memory cell having a stacked gate structure. FIG. 4 explains another embodiment of structure wherein the oxide insulating film 218 is a 2-ply layer consisting of layers 218-1 and 218-2, and a shallowest through hole 210-62 is formed over a wiring 206-2 formed on the first layer of the oxide insulating film 218-1, so that the depth of the shallowest through hole 210-62 substantially differs from the depths of the through holes 210-1 and 210-3 over the silicon substrate (a diffusion layer).

When the growth volume of tungsten is matched with the depth of the shallowest through hole 210-6 or 210-62 in these two typical embodiments, the contact to a wiring layer at the deep through holes 210-1 and 210-3 may become insufficient, so that the effect of filling the through holes with tungsten would be substantially lost thus raising a problem.

It can be said that the defects as mentioned above are brought about from the technique of discriminately growing tungsten over the whole through holes when there are a plurality of through holes having different depths from each other. However, there has not been known a technique of selectively filling tungsten only in selected one or ones of the through holes.

There is another problem in the above-mentioned technique of the contact-filling when it is applied to the manufacture of semiconductor devices as explained below.

Namely, in the step of forming aluminum wiring layer for obtaining a desired electric contact subsequent to the perforation of a through hole, a pattern of a deep through hole 210-1 is generally utilized as an alignment mark for the patterning of a wiring layer. However, when the deep through hole 210-1 is filled with a conductive material by using the above-mentioned burying technique of realizing an excellent flatness, the step which is formed around the upper portion of the deep through hole 210-1 is now lost thereby causing the detection of the alignment mark (the pattern of the through hole 210-1) difficult, thus increasing the possibility of false detection.

As explained above, it is impossible according to the conventional selective CVD method of filling tungsten in a through hole to make a selection between a through hole to be filled with tungsten and a through hole not to be filled with tungsten among a plurality of through holes having different depths from each other, and to allow tungsten to be filled into only desired one or ones of the through holes.

It is also pointed out as a problem that it is difficult according to the conventional selective CVD growth method to detect an alignment mark consisting of a through hole pattern in the step of forming aluminum wiring layer.

SUMMARY OF THE INVENTION

The present invention has been accomplished in view of solving above problems, and its object is to provide a method of manufacturing a semiconductor device, which is capable of selecting desired one or ones of through holes among a plurality of through holes having different depths from each other, and allows a high-melting point metal such as tungsten to be filled into only desired one or ones of the through holes, and at the same time capable of easily detecting an alignment mark consisting of a through hole pattern.

According to the present invention, there is provided a method of manufacturing semiconductor devices, which comprises the steps of:

forming a first conductive region consisting of a first conductive material for effecting a growth of a conductive film thereon by a selective growth method;

forming a second conductive region consisting of a second conductive material for not effecting a growth of a conductive film thereon in the selective growth method;

forming an insulating layer covering the first and second conductive regions;

forming a through hole passing through the insulating layer for growing a conductive film over the first conductive region by the selective growth method; and growing the conductive film within the through hole formed in the insulating layer over the first conductive region by the selective growth method and filling the through hole with the conductive film.

According to this method of manufacturing semiconductor devices, it is possible to select desired one or ones of through holes among a plurality of through holes having different depths from each other, and allows a high-melting point metal such as tungsten to be filled into only desired one or ones of the through holes, and at the same time to easily detect an alignment mark consisting of a through hole pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 10 is a partial sectional view of a wafer substrate explaining a next step following the step shown in FIG. 9;

FIG. 11 is a partial sectional view of a wafer substrate explaining a final step following the step shown in FIG. 10;

FIG. 13 is a partial sectional view of a wafer substrate explaining a final step of another embodiment (which corresponds to the step shown in FIG. 11) according to the present invention;

FIG. 15 is a partial sectional view of a wafer substrate explaining a final step in another embodiment of the present invention;

FIG. 16 is a partial sectional view of a wafer substrate explaining a final step in still another embodiment of the present invention;

FIG. 17 is a partial sectional view of a wafer substrate explaining a final step in still another embodiment of the present invention; and FIG. 18 is a partial sectional view of a wafer substrate explaining a final step in still another embodiment of the present invention.

DETAILED DESCRIPTION OF THE PREFERRED EMBODIMENTS

Figure 1:
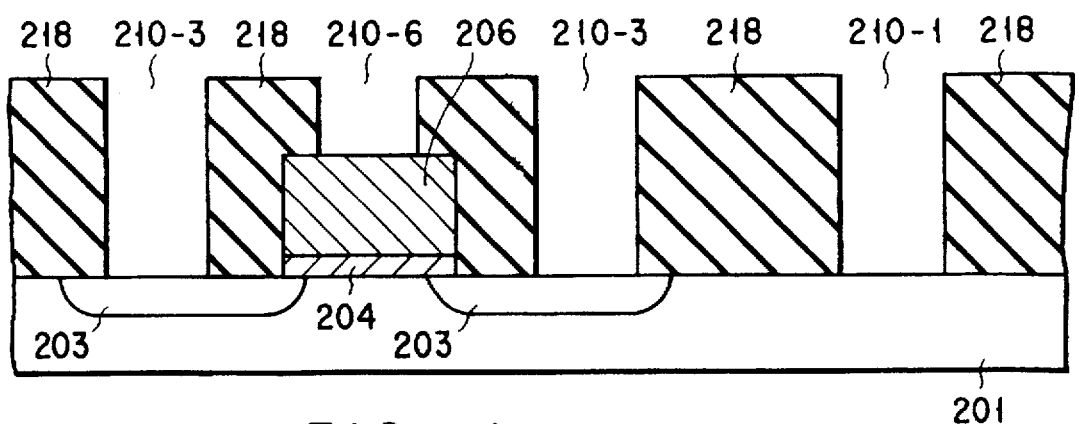
FIG. 1 is a partial sectional view of a wafer substrate representing a step of a selective CVD growth method to be utilized in the conventional manufacturing method of a non-volatile memory.
Figure 2:
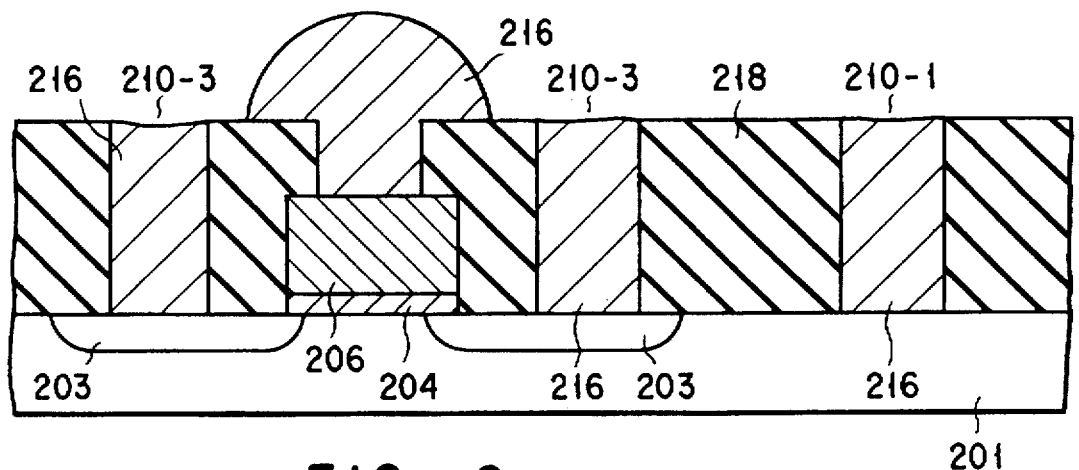
FIG. 2 depicts a partial sectional view of a wafer substrate explaining a next step following the step shown in FIG. 1.
Figure 3:
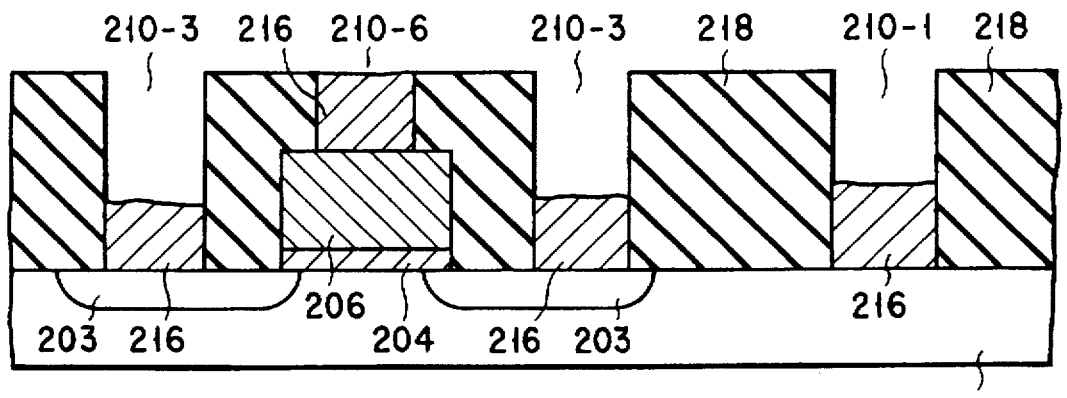
FIG. 3 is a partial sectional view of a wafer substrate explaining a different step from that of the selective CVD growth method shown in FIG. 2.
Figure 4:
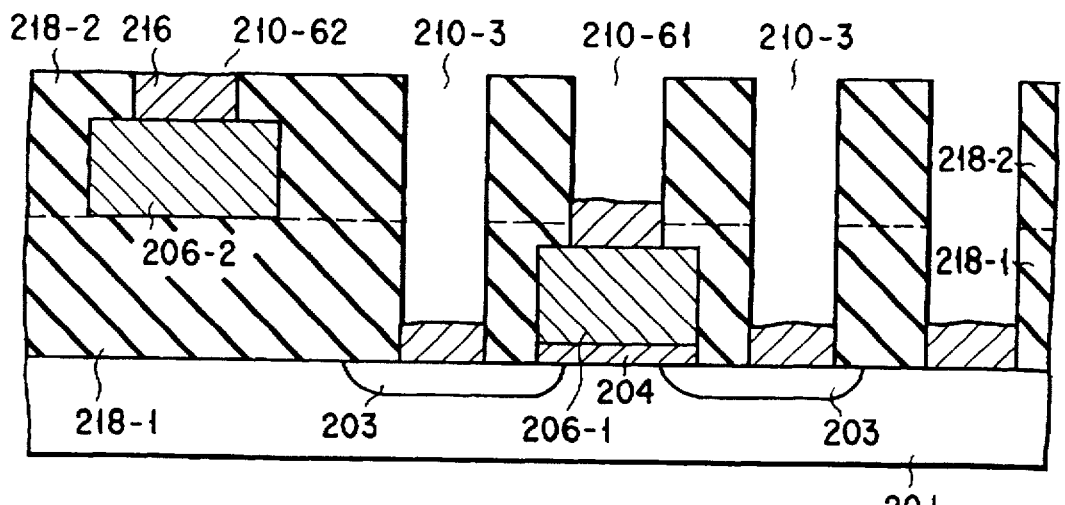
FIG. 4 is a partial sectional view of a wafer substrate explaining a different step from those shown in FIGS. 2 and 3.

This invention will be further explained with reference to the embodiments shown in the drawings.

FIGS. 5 to 7, and FIGS. 8 to 10 represent sectional views showing major steps in the manufacturing process of a non-volatile memory for explaining a first embodiment of this invention.

According to the manufacturing method of this invention, at first, a first conductive region consisting of a first conductive material is formed on part of the surface of a semiconductor substrate, then a second conductive region consisting of a second conductive material is formed on other part of the surface of the semiconductor substrate, and subsequently an insulating layer is formed all over the surface of the semiconductor substrate.

Figure 5:
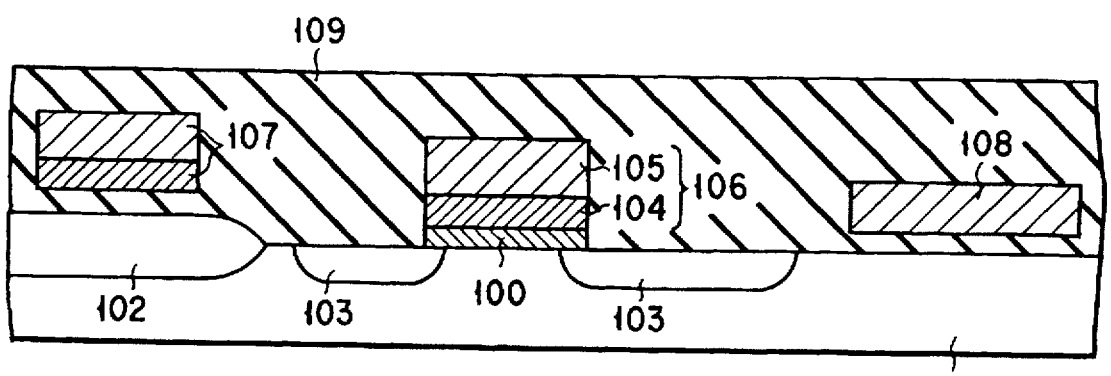
FIG. 5 is a partial sectional view of a wafer substrate representing a step of a selective CVD growth method to be utilized in the manufacturing method of a non-volatile memory according to the present invention.
Figure 6:
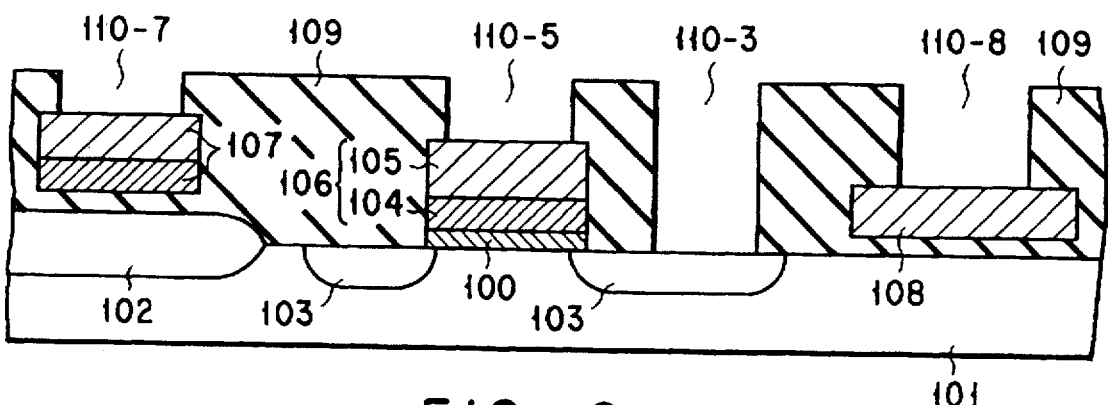
FIG. 6 is a partial sectional view of a wafer substrate explaining a next step following the step shown in FIG. 5.

Namely, as shown in FIG. 5, an element isolation oxide film 102 and a semiconductor element (for embodiment, MOS transistor) are formed on a p-type silicon (Si) substrate 101, and then a CVD oxide film 109 is deposited all over the surface of the semiconductor substrate.

Further, a gate insulating film 100 is formed on the substrate 101, and a gate electrode 106 is formed on the gate insulating film 100. This gate insulating film 100 is for example a polycide gate electrode comprising a polycrystalline silicon 104 and a layer of $WSi_2$ (tungsten silicide) 105 stacked on the polycrystalline silicon 104. Source and drain diffusion layers 103 are formed on the surface region of the substrate 101.

Simultaneously with the formation of the MOS transistor, a wiring layer 107 consisting of a polycide layer which has been deposited in the same step as that of the gate electrode 106 is formed.

This wiring layer 107 may be a single layer of $WSi_2$ deposited either in the same step as that of the gate electrode 106 or in a separate step. In any case, the effect of this invention as explained hereinafter will be obtained. In this embodiment however, this wiring layer 107 will be explained as being a stacked structure comprising a polycrystalline silicon 104 and a layer 105 of $WSi_2$ stacked on the polycrystalline silicon 104.

An underlayer of this wiring layer 107 may be any kind of material, but in this example, one embodiment wherein the wiring layer 107 is formed on an element isolation film 102 is shown.

In an ordinary process of manufacturing a semiconductor device, an alignment mark is formed on the semiconductor substrate by utilizing a through hole pattern as explained hereinafter in the process of forming an aluminum wiring to be electrically connected to an underlayer via a through hole which is perforated in advance in the aforementioned CVD oxide film 109.

An underlayer of this through hole pattern to be utilized as an alignment mark may be any kind of material or structure, but in this embodiment, one example wherein the underlayer comprises a single layer 108 of $WSi_2$ is shown.

Subsequently, an etching resist pattern (not shown) is formed on the CVD oxide film 109, and then a prescribed portion of the CVD oxide film 109 is etched off by using the resist pattern as a mask, thereby forming a through hole 110-3 to expose the silicon diffusion layer 103, as well as forming through holes 110-5, 110-7 and 110-8 to expose the $WSi_2$ layers 105, 107 and 108 respectively.

Figure 7:
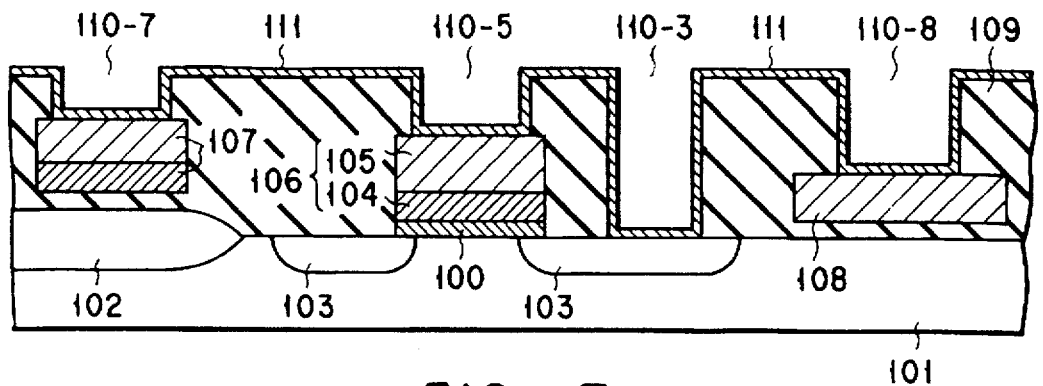
FIG. 7 is a partial sectional view of a wafer substrate explaining a next step following the step shown in FIG. 6.

A high melting point metal for example Ti (titanium) 111 as a fourth conductive material is then formed as shown in FIG. 7 all over the surface of the substrate 101 thereby depositing a layer of Ti 111, about 30 nm in thickness.

Figure 8:
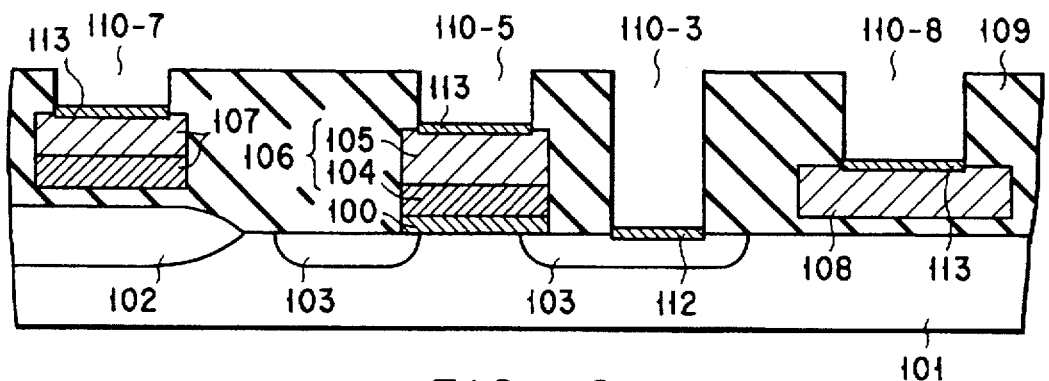
FIG. 8 is a partial sectional view of a wafer substrate explaining a next step following the step shown in FIG. 7.

Subsequently, the layer of Ti 111 is transformed into a silicide by heat-treating it at a temperature according to a silicide process. Unreacted portions of Ti 111 which are disposed on the CVD oxide film 109, and not transformed into a silicide in this step of heat treatment are then etched off by treating the unreacted portions with for example an acid. As a result, a titanium silicide layer is formed respectively on the diffusion layer 103 of the silicon substrate and on the bottom surface of the contact hole of each $WSi_2$ layer 105, 107 and 108 as shown in FIG. 8.

In this case, the titanium silicide layer which is disposed on the diffusion layer 103 of the silicon is in the form of $TiSi_2$ 112, but the titanium silicide layers which are disposed on the $WSi_2$ layer 105, 107 and 108 are turned respectively into the form of $TiSi_x (x<2)$ 113.

Figure 9:
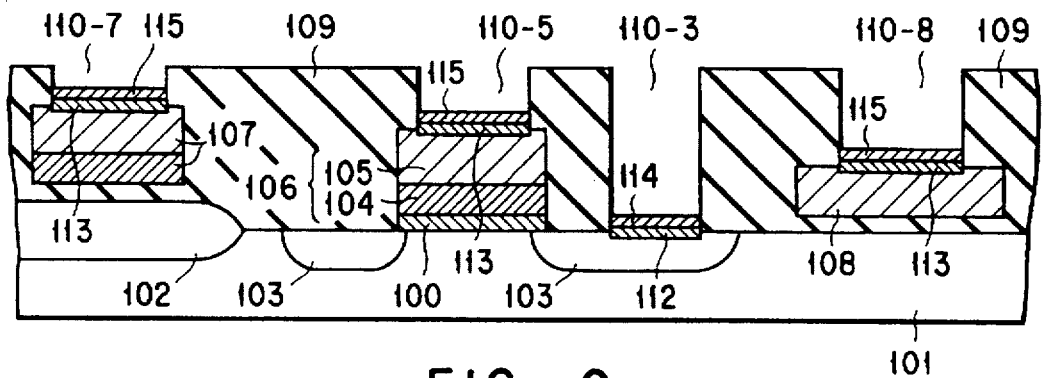
FIG. 9 is a partial sectional view of a wafer substrate explaining a next step following the step shown in FIG. 8.

Subsequently, a step is taken for forming, through natural oxidation, a silicon oxide film ($SiO_2$) 114, about 5 nm in thickness on the $TiSi_2$ 112 layer disposed over the silicon diffusion layer 103, and a titanium oxide film ($TiO_x$) 115, about 20 nm in thickness on the $TiSi_x$ 113 layer disposed over the $WSi_2$ layer 105, 107 and 108 as shown in FIG. 9.

This step of forming the oxide layers may be performed through a wet oxidation process using for example a mixed solution of sulfuric acid and hydrogen peroxide. However, these oxide layers may be spontaneously formed without performing such a specific oxidation step as mentioned above during the aforementioned step of etching off the Ti 111 not yet transformed into a silicide.

Subsequently, the silicon oxide film 114 is removed under a condition wherein only the silicon oxide film 114 can be etched off by making use of the difference in thickness between the silicon oxide film 114 and $TiO_x$ 115. For example, the silicon oxide film 114 can be etched off using an anisotropic RIE (reactive ion etching) method under a condition which allows only the silicon oxide film 114 to be selectively etched in preference to the $TiO_x$ 115. Since the thickness of the silicon oxide film 114 to be etched off is about 5 nm at most, a wet etching process may be employed other than the RIE method.

A process of CVD selective growth is then performed to deposit for example W (tungsten) as a third conductive material on the $TiSi_2$ 112 layer disposed over the silicon diffusion layer 103.

In this case, since the $TiO_x$ 115 is still left as it is on the $WSi_2$ layer 105, 107 and 108 as shown in FIG. 10, W 116 is selectively grown only on the $TiSi_2$ 112 layer over the silicon diffusion layer 103 thereby forming a buried plug.

Thereafter, the $TiO_x$ 115 left on the $WSi_2$ layer 105, 107 and 108 is etched off thereby exposing the $TiSi_x$ 113.

Finally, as shown in FIG. 11, a metallic wiring for example a multi-layered wiring layer 117 is formed by depositing Ti, TiN and Al—Si—Cu in this order whereby electrically connecting it with the bottom of each through hole, and then a top passivation film 118 is formed thereon.

In a first embodiment as explained above, a titanium silicide layer is respectively deposited on the silicon diffusion layer 103 substantially consisting of Si and constituting the bottom of a through hole and on the $WSi_2$ layer 105, 107 and 108 subsequent to the formation of a through hole 110 in the CVD oxide film 109 disposed over the semiconductor substrate 101, and is then oxidized. As a result, a silicon oxide film ($SiO_2$) 114, about 5 nm in thickness is formed on the $TiSi_2$ 112 layer disposed over the silicon diffusion layer 103, and a titanium oxide film ($TiO_x$) 115, about 20 nm in thickness is formed on the $TiSi_x$ (x<2) 113 layer disposed over the $WSi_2$ layer 105, 107 and 108.

After the silicon oxide film ($SiO_2$) 114 is removed under a condition wherein only the silicon oxide film 114 can be etched off by making use of the difference in thickness between the silicon oxide film 114 and $TiO_x$ 115, tungsten (W) is allowed to be selectively grown by means of CVD method. In this case, since the $TiO_x$ 115 is still left on the $WSi_2$ layer 105, 107 and 108, W 116 is selectively grown only over the silicon diffusion layer 103.

According to the first embodiment as explained above, it is possible to selectively grow tungsten only in a through hole over a silicon substrate (diffusion layer), which is largest in depth and most needed for performing a contact-burying process. Therefore, it is now possible to meet to the actual requirements in the introduction of selective contact-growth technique.

Moreover, since tungsten is not grown in a through hole to be used for an alignment mark in the process of forming a wiring 117 of such as Al, it is possible to carry out the burying technique without setting forth problems of losing a step portion around the through hole and inviting inconvenience in detecting the alignment mark.

In the aforementioned first embodiment, the explanation is made on a case where a through hole which is directly opened to silicon is formed only over the substrate (a diffusion layer), and any of the gate electrode, wiring layer and the underlayer of alignment mark pattern are provided as an uppermost layer with a $WSi_2$ layer, so that tungsten can be selectively grown only over the substrate (a diffusion layer).

Figure 12:
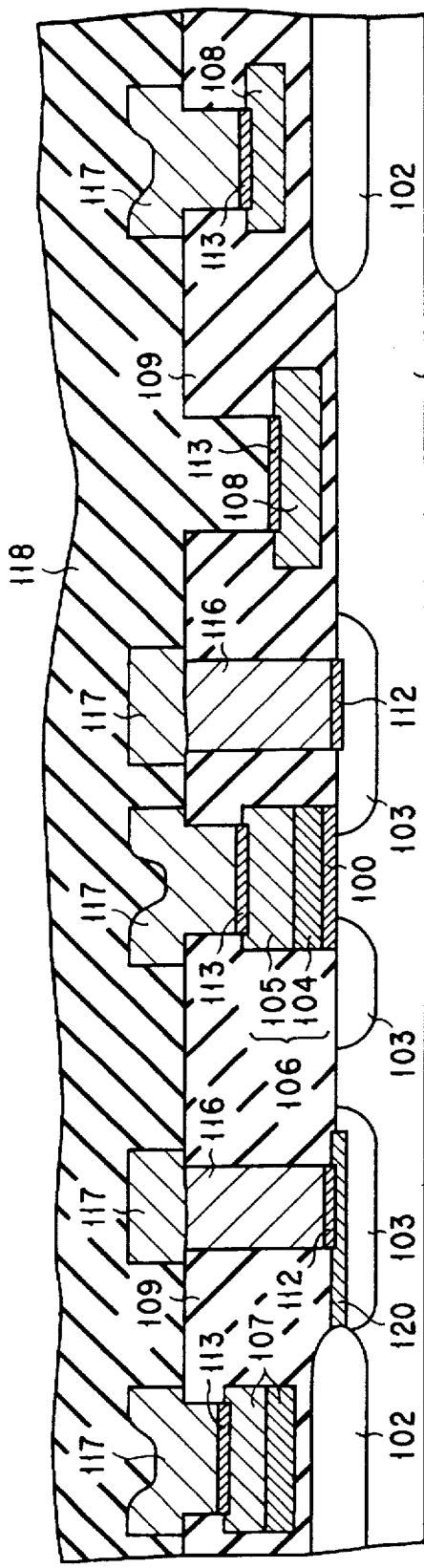
FIG. 12 is a partial sectional view of a wafer substrate explaining another embodiment wherein another constituent is added to the construction shown in FIG. 11.

FIG. 12 illustrates another embodiment wherein an additional constituent is added to the construction shown in FIG. 11. In this embodiment, the same portions as those explained in FIG. 11 are indicated by the same reference numerals as in FIG. 11 for the sake of omitting the explanations thereof.

Although it has been explained in the embodiment shown in FIG. 11 that the titanium silicide layer ($TiSi_2$) 112 is formed as an underlayer over the silicon diffusion layer 103, the underlayer is not limited to a single layer of the titanium silicide layer 112, but may be a multi-layer consisting of an conductive layer 120 made of, for example, epitaxially grown Si and a titanium silicide layer ($TiSi_2$) 112 provided on the conductive layer 120.

Further, although it has been explained in the embodiment shown in FIG. 11 that the titanium silicide layer ($TiSi_x$) 113 is formed as a mask pattern underlayer over the tungsten silicide ($WSi_2$) layer 108, the mask pattern underlayer may be formed into a structure wherein the titanium silicide layer 113 is electrically connected to the wiring layer 117 of Al and the like.

FIG. 13 illustrates a partial sectional view of a wafer substrate explaining a final step of another embodiment (which corresponds to the step shown in FIG. 11) according to the present invention.

This embodiment differs from that shown in FIG. 11 in that tungsten silicide ($WSi_2$) 108 is employed as a material for underlayers of the gate electrode, wiring layer and the underlayer of alignment mark pattern, which also constitute underlayers of through holes not to be filled with tungsten, and that a polycrystalline silicon 119 is employed as a material for the underlayer (such as a gate electrode or a wiring layer) of relatively deep through holes if tungsten is to be filled into the relatively deep through holes.

If the underlayers of through holes (such as a gate electrode or a wiring layer) are formed in advance with a material which allows the deposition of tungsten in separate to underlayers on which the deposition of tungsten should not be allowed in the embodiment shown in FIG. 13, the manufacturing steps after the formation of the through holes would be the same as that of the embodiment shown in FIG. 11.

Namely, in this embodiment, a layer of $TiSi_2$ and a layer of $SiO_2$ are formed in this order on the silicon substrate (a diffusion layer) and on the polycrystalline silicon, so that once the layer of $SiO_2$ is removed, tungsten can be selectively formed on the layer of $TiSi_2$.

On the other hand, since the $TiSi_x$ (x<2) layer 113 and the $TiO_x$ layer are formed in this order on the $WSi_2$ layer, tungsten would not be deposited over the $WSi_2$ layer 113.

In most of the actual semiconductor device, a plurality of through holes having a different depth from each other coexist in the same substrate, so that it is advisable not to fill a conductive material such as tungsten into a through hole which is relatively small in aspect ratio and shallow in depth, but to fill a conductive material in such a manner as to match the depth of a through hole which is relatively high in aspect ratio and the shallowest in depth among through holes to be filled with a conductive material.

In the embodiments explained above, a silicon substrate (a diffusion layer) and polycrystalline silicon are selected as an example of an underlayer film of a through hole to be filled with tungsten. However, since the method of this invention is effective as long as the oxide film to be formed on the surface of a silicon film as a result of the reaction between the underlayer and Ti deposited on the underlayer is in the form of $SiO_2$, a silicon-rich (a high silicon concentration) silicide film or a laminated film including the silicon-rich silicide film as an uppermost layer can also be employed.

Figure 14:
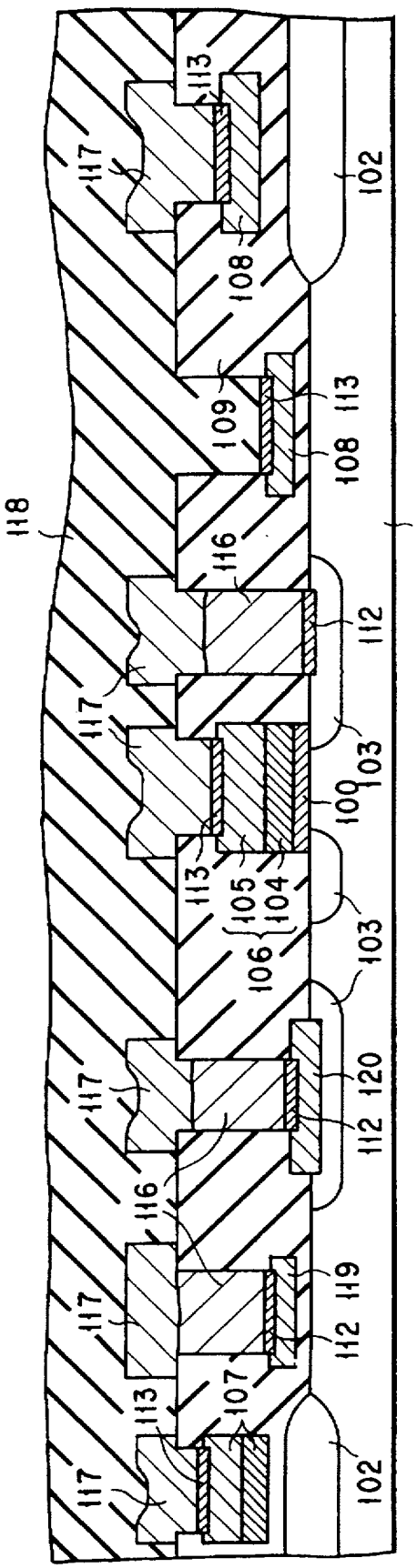
FIG. 14 is a partial sectional view of a wafer substrate explaining another embodiment wherein another constituent is added to the construction shown in FIG. 13.

FIG. 14 illustrates a sectional view of a wafer substrate as obtained in the final step according to another embodiment of this invention. In this embodiment shown in FIG. 14, it is demonstrated that various structures explained in FIG. 12 and FIG. 13 can be concurrently realized in a single substrate. Accordingly, the explanations of these structures in FIG. 14 are omitted.

In the embodiments explained above, a single layer of tungsten silicide or a polycide comprising $WSi_2$ (an upper layer) and polycrystalline silicon (a lower layer) is employed as an embodiment of the underlayer of a through hole not to be filled with tungsten (or an underlayer film which does not allow the growth of tungsten), i.e. the underlayer of the gate electrode, wiring layer or alignment mark pattern. However, the material for the underlayer inhibiting the growth of tungsten is not restricted to these embodiments.

In the case where Ti is deposited on the underlayer for prohibiting growth of W, a silicon film, such as a $TiSi_x$ (x<2) film, will be formed. This silicide film is silicon-poor (having low Si concentration). On the silicon-poor $TiSi_x$ film there can be formed an oxide film, e.g., a $TiO_x$ film or a film mainly consisting of $TiO_x$, which is thicker than an $SiO_2$ film. Hence, the advantage of this invention can be achieved by using a material which can form such an oxide film on the silicon-poor TiSi$_x$ film.

In other words, a material for the underlayer film which does not allow the growth of tungsten is not restricted to tungsten silicide (WSi$_2$) film, but any other silicide film or similar film which supplies only an insufficient amount of silicon during the formation of titanium silicide may be employed. For example, a metal selected from W, Mo, Ti, Al and Cu, or a silicide thereof, or a laminated film including one of these metals as an uppermost layer may be employed for such an underlayer film.

Further, a material for forming a silicide is not restricted to Ti employed in the above embodiments. Other high melting point metals such as Ti, Co, Ni or Mo may be employed as long as an oxide (MOx) to be formed during a subsequent oxidation step of the material is relatively large in thickness as compared with the SiO$_2$ layer which is at most about 5 nm in thickness, and at the same time is capable of etching the SiO$_2$ under the condition wherein the etching selectivity of SiO$_2$ to MOx is enlarged.

Additionally, if a silicon-poor silicide film (MSi$_x$) or a metal film which is capable of forming MOx (a film which is much thicker as compared with a SiO$_2$ layer having a thickness of at most about 5 nm, or a film which will be left after the etching step of SiO$_2$ due to its slow etching rate as compared with that of SiO$_2$) in preference to SiO$_2$ is employed, the step of forming a silicide may be dispensed with.

FIG. 15 illustrates the final step in an embodiment where the step of forming a silicide is omitted. In FIG. 15, polycrystalline silicon 119 is employed as an example of an underlayer of a through hole to be filled with tungsten 116, while metallic molybdenum Mo 124 is employed as an example of an underlayer of a through hole not to be filled with tungsten 116.

In this case, when a semiconductor substrate is exposed to a light oxidation atmosphere subsequent to the formation of through holes, a SiO$_2$ layer is formed at the bottom of a through hole to be subsequently filled with tungsten, and at the same time a MOx layer is formed at the bottom of a through hole not to be filled with tungsten. The SiO$_2$ layer is subsequently removed thus leaving the MOx layer. As a result, since the MOx layer is left unremoved, tungsten is selectively grown only on the regions where the SiO$_2$ layer is removed.

As for the material to be selectively grown, any other metals (such as Al, Si or Cu) other than tungsten may be employed without hindering the effect of this invention as long as the metal has the same degree of selectivity as that of tungsten.

In the above embodiments, an electric connection of a silicon substrate (a diffusion layer) or of electrodes to the wiring layer is effected through tungsten for instance which has been filled into a through hole. Further, the term through hole used throughout the above embodiments is described as an example to be used for a structure of a so-called contact hole. However, through hole is also applicable to a via hole. For example, FIG. 16 illustrates a laminated structure comprising a first insulating film (SiO$_2$) 130 and a second insulating film (SiO$_2$) 131, wherein tungsten 122 for example is filled into through holes, i.e. via holes 410-1 and 410-2 formed in the second insulating film (SiO$_2$) 131 in order to realize an electrical connection between the electrodes or wirings 119, 120 formed on the first insulating film (SiO$_2$) 130 and the electrodes or wirings 123 formed on the second insulating film (SiO$_2$) 131. As clearly understood from FIG. 16, there is no substantial distinction between a contact hole and a via hole as far as the effect to be obtained by the application of this invention is concerned.

The embodiment shown in FIG. 16 will be further explained in detail as follows.

First, a diffusion layer 103 and electrodes 205, 206 are formed on a silicon substrate 110, and then the first insulating film (SiO$_2$) 130 is deposited. Thereafter, through holes (contact holes) 310-1 and 310-2 are formed in the first insulating film (SiO$_2$) 130, and tungsten 116 is selectively grown on a metal silicide 207 formed at the bottom of the through holes (contact holes) 310-1 and 310-2, in the same manner as described in the above embodiments.

Then, electrodes or wirings 119, 120 are formed on the first insulating film (SiO$_2$) 130. In this case, polycrystalline silicon for example is used as a material for the electrode or wiring 119, and tungsten silicide for embodiment is used as a material for the electrode or wiring 120. Subsequently, the second insulating film (SiO$_2$) 131 is deposited over the first insulating film (SiO$_2$) 130, and then via holes 410-1, 410-2 and 410-3 for forming a contact with the electrodes or wirings 119, 120 are formed in the second insulating film (SiO$_2$) 131.

Subsequently, a conductive material for example Ti (titanium) is deposited on the second insulating film (SiO$_2$) 131, and then processed to form a silicide thereof. As a result, TiSi$_2$ 208 is formed on the electrodes or wirings 119, and TiSi$_x$ (x<2) 209 is formed on the electrodes or wirings 120. Thereafter, a treatment is performed to expose only the silicide film 208 by making use of difference in thickness of these oxide films to be formed on the surfaces of silicide films 208 and 209, thereby allowing tungsten 122 for example to be selectively deposited only in the via holes 410-1 and 410-2.

Thereafter, a metallic multi-layered wiring 123 comprising for example Ti/TiN/Al—Si—Cu is formed as a second electrode or wiring according to the ordinary process of manufacturing a semiconductor device.

In this manner, tungsten can be selectively filled into a via hole by selecting the material for the underlayer of a through hole in the same manner as in the case of filling a contact hole. Accordingly, there is no distinction between the contact hole and via hole in the processing to be performed or effects to be obtained in exercising this invention. It should be noted that although polycrystalline silicon is selected as an underlayer of the via hole 410 to be filled with a conductive material, tungsten silicide is selected as an underlayer of the via hole 410 not to be filled with a conductive material, and titanium is selected as a conductive material to be deposited on the underlayer in the embodiment of FIG. 15, these materials can be replaced by other kinds of materials in the same manner as explained with the contact hole of the previous embodiments.

In the embodiment shown in FIG. 16, polysilicon 119 and tungsten silicide 120 are respectively employed as a single layer for an electrode or wiring of the first layer. However, it is of course possible to employ a multi-layered electrode or wiring as already explained with reference to the embodiments of filling the contact holes. FIG. 17 illustrates such an embodiment. Since the sole difference between the embodiment shown in FIG. 16 and the embodiment shown in FIG. 17 is the structure of the first electrode or wiring layer, the detailed explanation of the structure of FIG. 17 is omitted. In this embodiment, polycrystalline silicon 119 is formed as the first electrode or wiring layer disposed below the via holes 410-1, 410-2 to be filled with tungsten 122, and a stacked layer comprising polycrystalline silicon 119 and tungsten silicide 120 is formed as the first electrode or wiring layer disposed below the via holes 410-3.

FIG. 18 illustrates still another embodiment, wherein a stacked layer comprising Al—Si—Cu—/TiN/Ti 121 and polycrystalline silicon 119 is deposited on the first insulating film 130, and, after performing the patterning of the stacked layer, interlaminar insulating film 131 is deposited. Subsequently, via holes 410-1, 410-2 and 410-3 are formed. In this case, the etching of the interlaminar insulating film 131 is terminated as the polysilicon 119 is exposed. Then, a region including via holes 410-1, 410-2 is covered with for example a resist, and then polycrystalline silicon 119 which is disposed and exposed at the bottom of the via hole 410-3 is etched off. Subsequently, titanium for example is deposited and subjected to silicidation. Thereafter, tungsten is selectively grown thereon.

By the way, there is another method wherein Al—Si—Cu—/TiN/Ti 121 is deposited, and then polycrystalline silicon 119 is deposited thereon. Subsequently, polycrystalline silicon 119 disposed below the via hole 410-3 not to be filled with tungsten is removed thus leaving only Al—Si—Cu—/TiN/Ti 121. Then, the interlaminar insulating film 131 is deposited, and the via hole 410-3 is again formed in the insulating film 131.

The method of this embodiment is not illustrated in the embodiments described relative to the contact hole (FIGS. 1 to 15). However, it would be apparent that this method is also applicable to the process of filling the contact hole.

The gist of this invention resides in arbitrarily selecting which through hole should be or should not be filled with a conductive material by selecting the material of the underlayer of a through hole. Accordingly, in the technical viewpoint of this invention, there is no distinction between a contact hole and a via hole. Therefore, the expression of a via hole is used in the embodiments shown in FIGS. 16 to 18 merely for the convenience of explaining the invention. Accordingly, three different methods employed for filling the via hole explained above can be also applicable to the embodiments of filling the contact hole.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing semiconductor devices, which comprises the steps of:
    forming a first conductive region consisting of a first conductive material on a portion of a first silicon region, and a second conductive region consisting of a second conductive material on a portion of a second silicon region, which is different from the portion where said first conductive region is formed;
    forming an insulating layer to cover at least the surfaces of said first and second silicon regions;
    forming through holes in said insulating layer to expose said first and second conductive regions;
    forming a silicon oxide layer on bottom surfaces of said through holes where said first conductive material is exposed, and forming an oxide layer comprising at least a metal oxide layer on bottom surfaces of said through holes where said second conductive material is exposed;
    removing said silicon oxide layer disposed on said first conductive material by etching while maintaining said oxide layer comprising at least a metal oxide layer on said second conductive material;
    depositing a third conductive material by using a selective growth method on bottom surfaces of said through holes where said first conductive material is exposed; and
    removing said oxide layer comprising at least a metal oxide layer on said second conductive material.

2. The method of manufacturing semiconductor devices according to claim 1, which further comprises the steps of:
    depositing a fourth conductive material to cover the surfaces of said first and second silicon regions following the step of forming said through holes in said insulating layer;
    heat-treating said fourth conductive material to transform it into a silicide; and
    removing said fourth conductive material which has not been transformed into a silicide in the previous step.

3. The method of manufacturing semiconductor devices according to claim 2, wherein said fourth conductive material is a high-melting point metal selected from the group consisting of Ti, Co, Ni and Mo.

4. The method of manufacturing semiconductor devices according to claim 1, wherein said through holes which are formed in said insulating layer include a contact hole to be used as an alignment mark in a subsequent step.

5. The method of manufacturing semiconductor devices according to claim 1, wherein said first conductive material comprises a silicon film.

6. The method of manufacturing semiconductor devices according to claim 5, wherein said silicon film is made of monocrystalline silicon.

7. The method of manufacturing semiconductor devices according to claim 5, wherein said silicon film is made of polycrystalline silicon.

8. The method of manufacturing semiconductor devices according to claim 1, wherein said first conductive material comprises a stacked film including as an uppermost layer a silicon film.

9. The method of manufacturing semiconductor devices according to claim 1, wherein said first conductive material comprises a silicon-rich silicide film.

10. The method of manufacturing semiconductor devices according to claim 1, wherein said first conductive material comprises a stacked film including as an uppermost layer a silicon-rich silicide film.

11. The method of manufacturing semiconductor devices according to claim 1, wherein said second conductive material comprises a film of a metal selected from the group consisting of W, Mo, Ti, Al and Cu.

12. The method of manufacturing semiconductor devices according to claim 1, wherein said second conductive material comprises a silicide film of a metal selected from the group consisting of W, Mo, Ti, Al and Cu.

13. The method of manufacturing semiconductor devices according to claim 1, wherein said second conductive material comprises a stacked film including as an uppermost layer a silicide film of a metal selected from the group consisting of W, Mo, Ti, Al and Cu.

14. The method of manufacturing semiconductor devices according to claim 1, wherein said third conductive material is a film of an element selected from the group consisting of W, Al, Si and Cu.

15. The method of manufacturing semiconductor devices according to claim 1, wherein said second conductive material is either silicon-poor silicide film or a metal film.

16. The method of manufacturing semiconductor devices according to claim 1, wherein said second conductive material is a stacked film including as an uppermost layer either silicon-poor silicide film or a metal film, and said step of forming said silicon oxide layer is performed using natural oxidation.

17. The method of manufacturing semiconductor devices according to claim 1, wherein among said through holes, a through hole on which said third conductive material is deposited by using a selective growth method is deeper than a through hole on which said third conductive material is not deposited.

18. The method of manufacturing semiconductor devices according to claim 17, wherein the through hole on which said third conductive material is not deposited is used as an alignment mark and is not as deep as the through hole on which said third conductive material is deposited.

19. A method of manufacturing semiconductor devices, which comprises the steps of:

forming a first conductive region consisting of a first conductive material on a portion of a first silicon region, and a second conductive region consisting of a second conductive material on a portion of a second silicon region which is different from the portion where said first conductive region is formed;

forming a first insulating layer to cover at least the surfaces of said first and second silicon regions;

forming through holes in said first insulating layer to expose said first and second conductive regions;

forming a silicon oxide layer on bottom surfaces of said through holes where said first conductive material is exposed, and forming an oxide layer comprising at least a metal oxide layer on bottom surfaces of said through holes where said second conductive material is exposed;

removing said silicon oxide layer disposed on said first conductive material by etching while maintaining said oxide layer comprising at least a metal oxide layer on said second conductive material;

depositing a third conductive material by using a selective growth method on bottom surfaces of said through holes where said first conductive material is exposed;

removing said oxide layer comprising at least a metal oxide layer on said second conductive material;

forming a third conductive region consisting of a fifth conductive material above at least a portion of said first silicon region, and a fourth conductive region consisting of a sixth conductive material above at least a portion of said second silicon region which is different from the portion where said third conductive region is formed;

forming a second insulating layer on said first insulating layer;

forming through holes in said second insulating layer to expose said third and fourth conductive regions;

forming a silicon oxide layer on bottom surfaces of said through holes where said fifth conductive material is exposed, and forming an oxide layer comprising at least a metal oxide layer on bottom surfaces of said through holes where said sixth conductive material is exposed;

removing said silicon oxide layer disposed on said fifth conductive material by etching while maintaining said oxide layer comprising at least a metal oxide layer on said sixth conductive material;

depositing a seventh conductive material by using a selective growth method on bottom surfaces of said through holes where said fifth conductive material is exposed; and removing said oxide layer comprising at least a metal oxide layer on said sixth conductive material.

20. The method of manufacturing semiconductor devices according to claim 19, which further comprises the steps of:

depositing an eighth conductive material to cover at least the surfaces of said third and fourth silicon regions following the step of forming said through holes in said second insulating layer;

heat-treating said eighth conductive material to transform it into a silicide; and removing said eighth conductive material which has not been transformed into a silicide in the previous step.

21. The method of manufacturing semiconductor devices according to claim 20, wherein said eighth conductive material is a high-melting point metal selected from the group consisting of Ti, Co, Ni and Mo.

22. The method of manufacturing semiconductor devices according to claim 19, wherein said through holes formed in said second insulating layer include a contact hole to be used as an alignment mark in a subsequent step.

23. The method of manufacturing semiconductor devices according to claim 19, wherein said fifth conductive material comprises a silicon film.

24. The method of manufacturing semiconductor devices according to claim 23, wherein said silicon film is made of monocrystalline silicon.

25. The method of manufacturing semiconductor devices according to claim 23, wherein said silicon film is made of polycrystalline silicon.

26. The method of manufacturing semiconductor devices according to claim 19, wherein said fifth conductive material comprises a stacked film including a silicon film as an uppermost layer.

27. The method of manufacturing semiconductor devices according to claim 19, wherein said fifth conductive material comprises a silicon-rich silicide film.

28. The method of manufacturing semiconductor devices according to claim 27, wherein said fifth conductive material comprises a stacked film including a silicon-rich silicide film as an uppermost layer.

29. The method of manufacturing semiconductor devices according to claim 19, wherein said sixth conductive material comprises a film of a metal selected from the group consisting of W, Mo, Ti, Al and Cu.

30. The method of manufacturing semiconductor devices according to claim 19, wherein said sixth conductive material comprises a silicide film of a metal selected from the group consisting of W, Mo, Ti, Al and Cu.

31. The method of manufacturing semiconductor devices according to claim 19, wherein said sixth conductive material comprises a stacked film including as an uppermost layer a silicide film of a metal selected from the group consisting of W, Mo, Ti, Al and Cu.

32. The method of manufacturing semiconductor devices according to claim 19, wherein said seventh conductive material is a film of an element selected from the group consisting of W, Al, Si and Cu.

33. The method of manufacturing semiconductor devices according to claim 19, wherein said sixth conductive material is either a silicon-poor silicide film or a metal film.

34. The method of manufacturing semiconductor devices according to claim 19, wherein said sixth conductive material is a stacked film including as an uppermost layer either a silicon-poor silicide film or a metal film, and said step of forming a silicon oxide on bottom surfaces of said through holes where said fifth conductive material is exposed is performed using natural oxidation.

* * * * *